(12) United States Patent
Yang et al.

(10) Patent No.: US 10,790,448 B2
(45) Date of Patent: Sep. 29, 2020

(54) FLEXIBLE ELECTRODE FOR DISPLAY DEVICE

(71) Applicant: SAMSUNG DISPLAY CO., LTD., Yongin-si, Gyeonggi-do (KR)

(72) Inventors: Chan-Woo Yang, Yongin-si (KR); Seung-Bae Kang, Yongin-si (KR); Han-Su Kim, Yongin-si (KR); Bong-Won Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 374 days.

(21) Appl. No.: 15/689,396

(22) Filed: Aug. 29, 2017

(65) Prior Publication Data
US 2018/0145256 A1 May 24, 2018

(30) Foreign Application Priority Data
Nov. 18, 2016 (KR) .................. 10-2016-0154115

(51) Int. Cl.
| | |
|---|---|
| *H05K 1/00* | (2006.01) |
| *H01L 51/00* | (2006.01) |
| *H01L 51/52* | (2006.01) |
| *G06F 3/041* | (2006.01) |
| *H01L 51/56* | (2006.01) |

(52) U.S. Cl.
CPC .......... *H01L 51/0023* (2013.01); *G06F 3/041* (2013.01); *H01L 51/0097* (2013.01); *H01L 51/5203* (2013.01); *H01L 51/5209* (2013.01); *H01L 51/56* (2013.01); *G06F 2203/04102* (2013.01); *G06F 2203/04103* (2013.01); *H01L 2251/5338* (2013.01)

(58) Field of Classification Search
USPC ....................................................... 361/749
See application file for complete search history.

(56) References Cited

U.S. PATENT DOCUMENTS

2013/0161628 A1* 6/2013 Suzuki ................ H01L 23/544
257/59

FOREIGN PATENT DOCUMENTS

| KR | 10-2014-0093384 A | 7/2014 |
|---|---|---|
| KR | 10-2015-0033780 A | 4/2015 |

* cited by examiner

*Primary Examiner* — Andargie M Aychillhum
(74) *Attorney, Agent, or Firm* — Kile Park Reed & Houtteman PLLC

(57) ABSTRACT

A flexible electrode for a display device may include a conductive structure including a lower conductive pattern disposed on a substrate and an upper conductive pattern disposed on the lower conductive pattern, and an electrode layer disposed on the substrate, the electrode layer being adjacent to the conductive structure. A width of a top surface of the lower conductive pattern may be less than a width of a bottom surface of the upper conductive pattern.

24 Claims, 13 Drawing Sheets

FLEXIBLE ELECTRODE FOR DISPLAY DEVICE

CROSS-REFERENCE TO RELATED APPLICATION(S)

Korean Patent Application No. 10-2016-0154115, filed on Nov. 18, 2016, in the Korean Intellectual Property Office, and entitled: "Flexible Electrode for Display Device," is incorporated by reference herein in its entirety.

BACKGROUND

1. Field

Embodiments relate to a flexible electrode for a display device.

2. Description of the Related Art

A display device may include a display panel, a touch screen panel, etc. Each of the display panel and the touch screen panel may include a conductive element such as an electrode or a wiring.

SUMMARY

Embodiments are directed to a flexible electrode for a display device, including a conductive structure and an electrode layer. The conductive structure may include a lower conductive pattern disposed on a substrate and an upper conductive pattern disposed on the lower conductive pattern. The electrode layer may be disposed on the substrate. The electrode layer may be adjacent to the conductive structure. A width of a top surface of the lower conductive pattern may be less than a width of a bottom surface of the upper conductive pattern.

The lower conductive pattern may have a tapered shape in which a width of the lower conductive pattern decreases in a direction from the substrate to the upper conductive pattern.

A thickness of the lower conductive pattern may be greater than a thickness of the electrode layer.

The lower conductive pattern may include a transparent conductive oxide having an amorphous state.

The lower conductive pattern may include at least one of indium zinc oxide and aluminum zinc oxide.

The lower conductive pattern and the electrode layer may include substantially the same material.

The lower conductive pattern and the electrode layer may be integrally formed.

The upper conductive pattern may include a transparent conductive oxide having a crystalline state.

The upper conductive pattern may include indium tin oxide.

A plurality of nano-patterns may be formed on a surface of the upper conductive pattern.

The upper conductive pattern may include a first upper conductive pattern and a second upper conductive pattern disposed on the first upper conductive pattern.

The first upper conductive pattern may include a transparent conductive oxide having a crystalline state.

The first upper conductive pattern may include indium tin oxide.

The second upper conductive pattern and the electrode layer may include substantially the same material.

The second upper conductive pattern and the electrode layer may include at least one of a metal and a transparent conductive oxide.

The electrode layer may include a first electrode layer disposed on the substrate and a second electrode layer disposed on the first electrode layer.

The lower conductive pattern and the first electrode layer may include substantially the same material.

The lower conductive pattern and the first electrode layer may be integrally formed.

The second upper conductive pattern and the second electrode layer may include substantially the same material.

The second upper conductive pattern and the second electrode layer may include at least one of a metal and a transparent conductive oxide.

BRIEF DESCRIPTION OF THE DRAWINGS

Features will become apparent to those of skill in the art by describing in detail example embodiments with reference to the attached drawings in which.

DETAILED DESCRIPTION

Figure 1:
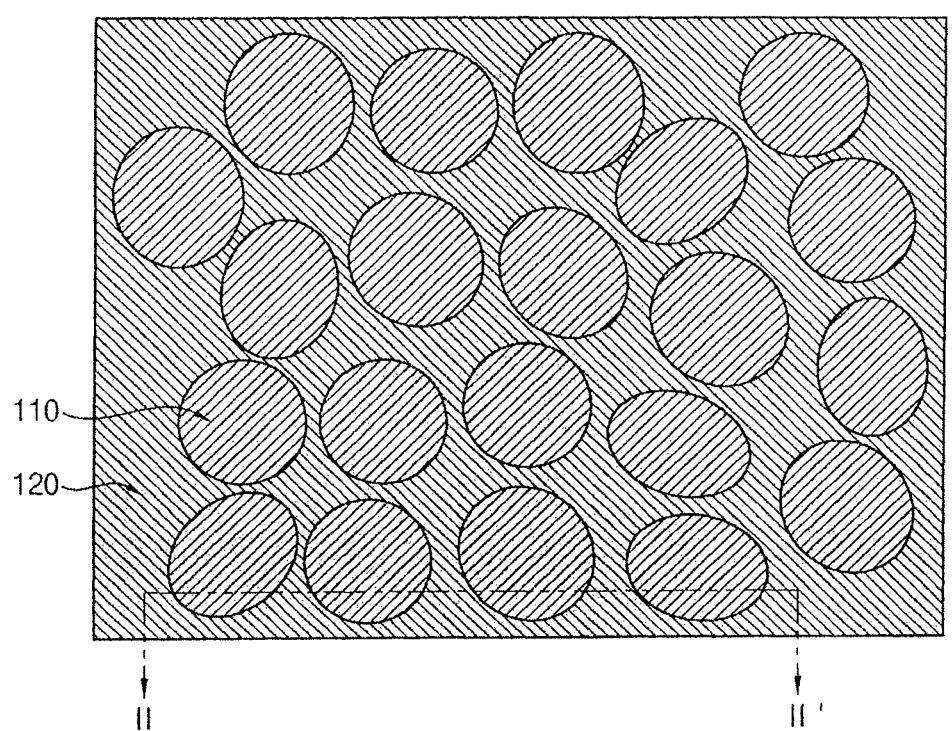
FIG. 1 illustrates a plan view of a flexible electrode according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

Figure 2:
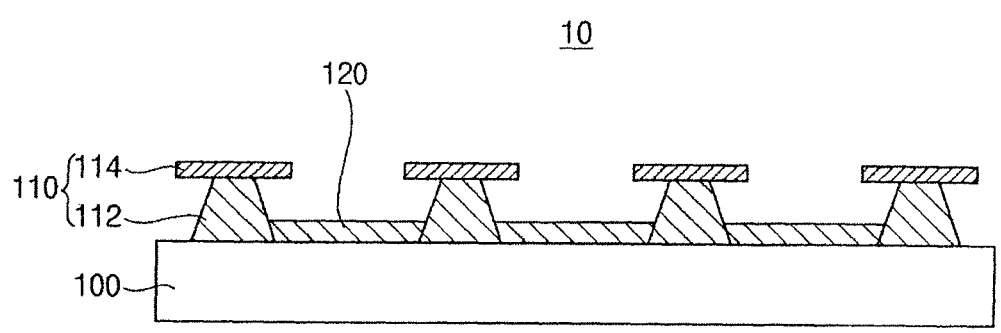
FIG. 2 illustrates a cross-sectional view of a flexible electrode according to an example embodiment.

FIG. 1 is a plan view of a flexible electrode according to an example embodiment. FIG. 2 is a cross-sectional view of a flexible electrode according to an example embodiment. For example, FIG. 2 may be a cross-sectional view cut along a line II-II' of the flexible electrode in FIG. 1.

Referring to FIGS. 1 and 2, a flexible electrode 10 according to an example embodiment may include a conductive structure 110 and an electrode layer 120.

The flexible electrode 10 may be used as, for example, an electrode and/or a wiring included in a display device. For example, the flexible electrode 10 may be used as an electrode and/or a wiring included in a display panel or as an electrode and/or a wiring included in a touch screen panel, for example, a flexible touch screen panel. The flexible electrode 10 may have electrical conductivity. The flexible electrode 10 may be bent or folded in a using process or a manufacturing process.

The flexible electrode 10 may include a plurality of conductive structures 110. The conductive structures 110 may be spaced apart from each other. Each conductive structure 110 may have an island shape, for example, a planar island shape.

The conductive structure 110 may include conductive material providing electrical conductivity. The conductive structure 110 may provide flexibility to the flexible electrode 10 to help reduce or prevent occurrence of cracks in the flexible electrode 10 and/or prevent diffusion of cracks when cracks occur in the flexible electrode 10.

The electrode layer 120 may surround the plurality of conductive structures 110. The electrode layer 120 may include conductive material, similar to the conductive structure 110, having electrical conductivity. The electrode layer 120 may contact and electrically connect the plurality of conductive structures 110 that are spaced apart from each other.

The conductive structure 110 may include a lower conductive pattern 112 and an upper conductive pattern 114. The conductive structure 110 may be disposed on a substrate 100.

The substrate 100 may be a flexible substrate. For example, the substrate 100 may include plastic having excellent heat-resistance and durability such as polyimide (PI), polyethylene terephthalate (PET), polycarbonate (PC), polyethylene naphthalate (PEN), polyarylate (PAR), polyetherimide (PEI), or the like.

The lower conductive pattern 112 may be disposed on the substrate 100. In an example embodiment, the lower conductive pattern 112 may include transparent conductive oxide (TCO) having an amorphous state. For example, the lower conductive pattern 112 may include at least one of indium zinc oxide (IZO) and aluminum zinc oxide (AZO).

The upper conductive pattern 114 may be disposed on the lower conductive pattern 112. In an example embodiment, the upper conductive pattern 114 may include transparent conductive oxide (TCO) having a crystalline state. For example, the upper conductive pattern 114 may include indium tin oxide (ITO).

A plurality of nano-patterns may be formed on a surface of the upper conductive pattern 114. For example, a plurality of microcrystals may be generated when transparent conductive oxide having an amorphous state is crystallized to become transparent conductive oxide having a crystalline state, and the plurality of nano-patterns may correspond to the plurality of microcrystals. The plurality of nano-patterns may provide flexibility to the flexible electrode 10.

As illustrated in FIG. 2, a width of a top region of the lower conductive pattern 112 may be less than a width of the upper conductive pattern 114. For example, the width of the top of the lower conductive pattern 112 may be less than a width of a bottom of the upper conductive pattern 114. The conductive structure 110 may have a shape in which the top of the lower conductive pattern 112 is narrower to form an undercut in relation to the upper conductive pattern 114.

The lower conductive pattern 112 may have a tapered shape in which a width of the lower conductive pattern 112 decreases in a direction from the substrate 100 to the upper conductive pattern 114. Therefore, a width of a bottom of the lower conductive pattern 112 may be greater than the width of the top of the lower conductive pattern 112. For example, the width of the bottom of the lower conductive pattern 112 may be greater than or substantially equal to the width of the top of the upper conductive pattern 114.

A thickness of the lower conductive pattern 112 may be greater than a thickness of the upper conductive pattern 114. For example, the thickness of the lower conductive pattern 112 may be in a range between about 100 angstroms (Å) and about 4000 Å, and the thickness of the upper conductive pattern 114 may be in a range between about 50 Å and about 1000 Å.

The conductive structure 110 may have a shape similar to that of a mushroom. For example, the lower conductive pattern 112 may have a shape similar to a stem (or a stalk) of the mushroom, and the upper conductive pattern 114 may have a shape similar to a cap of the mushroom. The nano-patterns formed on the surface of the upper conductive pattern 114 may have a shape similar to scales formed on a surface of the cap of the mushroom.

The electrode layer 120 may be disposed on the substrate 100. The electrode layer 120 may be adjacent to the conductive structure 110.

In an example embodiment, the electrode layer 120 may include transparent conductive oxide (TCO) having an amorphous state. For example, the electrode layer 120 may include at least one of indium zinc oxide (IZO) and aluminum zinc oxide (AZO).

In an example embodiment, the lower conductive pattern 112 and the electrode layer 120 may have substantially the same material. For example, a conductive layer may be formed of the same material on the substrate 100, and then the conductive layer may be etched to integrally form the lower conductive pattern 112 and the electrode layer 120.

A thickness of the lower conductive pattern 112 may be greater than a thickness of the electrode layer 120. A bottom surface of the lower conductive pattern 112 and a bottom surface of the electrode layer 120 may be located on substantially the same level over the substrate 100. The electrode layer 120 may not contact the upper conductive pattern 114 which is disposed on the lower conductive pattern 112, and may only contact the lower conductive pattern 112.

A distance between adjacent conductive structures 110 may be greater than a width of each conductive structure 110. For example, the distance between the adjacent conductive structures 110 may be in a range between about 1000 Å and about 10000 Å, and the width of each conductive structure 110 may be in a range between about 100 Å and about 5000 Å.

Figure 3A:
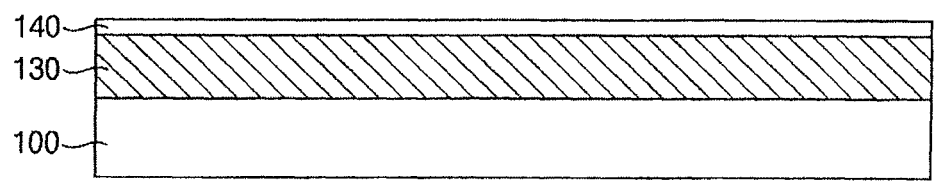
FIGS. 3A, 3B, and 3C illustrate cross-sectional views of a method of manufacturing a flexible electrode according to an example embodiment.
Figure 3B:
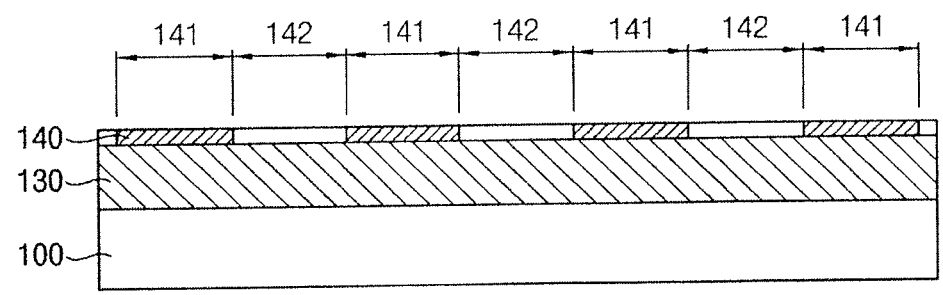
Figure 3C:
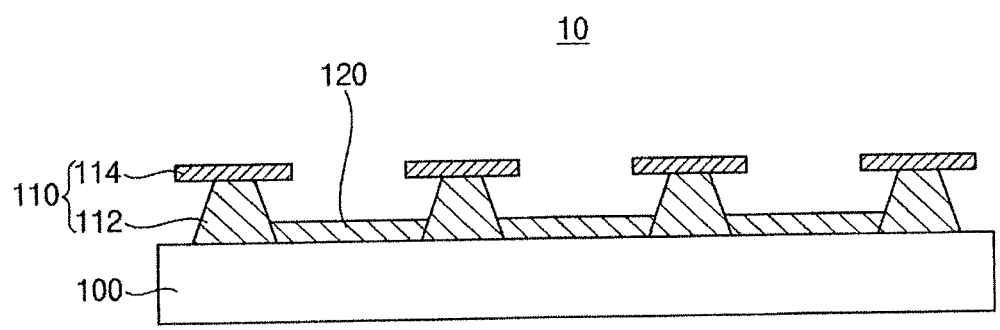

FIGS. 3A, 3B, and 3C are cross-sectional views of a method of manufacturing a flexible electrode according to an example embodiment.

Referring to FIG. 3A, a first conductive layer 130 may be formed on the substrate 100, and a second conductive layer 140 may be formed on the first conductive layer 130. The first conductive layer 130 and the second conductive layer 140 may be formed of transparent conductive oxide having an amorphous state. For example, a sputtering process may be performed at about 130° C. or less, for example, at room temperature, to form the first conductive layer 130 which includes indium zinc oxide (IZO) or aluminum zinc oxide (AZO) having an amorphous state on the substrate 110 and to form the second conductive layer 140 which includes indium tin oxide (ITO) having an amorphous state on the first conductive layer 130. Accordingly, the first and second conductive layers 130 and 140 which include transparent conductive oxide having an amorphous state may be formed at a relatively low temperature.

Referring to FIG. 3B, the second conductive layer 140 may be partially crystallized. For example, transparent conductive oxide having an amorphous state in a first region 141 of the second conductive layer 140 may be crystallized thereby becoming a crystalline region 141, and a second region 142 outside the first region 141 of the second conductive layer 140 may be allowed to remain as an amorphous region 142. For example, the crystalline region 141 of the second conductive layer 140 may include indium tin oxide having a crystalline state (p-ITO), and the amorphous region 142 of the second conductive layer 140 may include indium tin oxide having an amorphous state (a-ITO). The second conductive layer 140 may be partially crystallized so that the second conductive layer 140 may be selectively etched in a subsequent etching process.

In an example embodiment, a heat-treatment process may be performed to partially crystallize the second conductive layer 140 including transparent conductive oxide having an amorphous state. In this case, the crystalline region 141 may be formed at a random location in the second conductive layer 140.

In another example embodiment, a laser may be used to partially crystallize the second conductive layer 140 including transparent conductive oxide having an amorphous state. In this case, the laser may be irradiated to a region to be crystallized in the second conductive layer 140 to form the crystalline region 141.

Referring to FIG. 3C, the partially crystallized second conductive layer 140 and the first conductive layer 130 may be etched to form the conductive structure 110, which includes the lower conductive pattern 112 and the upper conductive pattern 114, and the electrode layer 120.

The second conductive layer 140 and the first conductive layer 130 may be simultaneously etched. For example, a wet etching process using an etchant may be performed to simultaneously etch the second conductive layer 140 and the first conductive layer 130. For example, the etchant may etch transparent conductive oxide having an amorphous state, however may not etch, or may more slowly etch, transparent conductive oxide having a crystalline state.

The amorphous region 142 of the second conductive layer 140 may be etched by the etchant, and the crystalline region 141 of the second conductive layer 140 may not be etched, or may be etched less, by the etchant and remain, so that the upper conductive pattern 114 may be formed. The first conductive layer 130 may be etched by the etchant to be partially removed. When the first conductive layer 130 is etched, the upper conductive pattern 114 may function as an etching mask. Therefore, the first conductive layer 130 under the amorphous region 142 of the second conductive layer 140 may be relatively over-etched by the etchant and may remain with a relatively thin thickness. However, the first conductive layer 130 under the crystalline region 141 of the second conductive layer 140 may be relatively under-etched by the etchant. In this case, the first conductive layer 130 may be etched in an isotropic manner from top of the first conductive layer 130 as illustrated in FIG. 3C, therefore, the lower conductive pattern 112 having a tapered shape in which a width of the lower conductive pattern 112 increases in a direction from the upper conductive pattern 114 to the substrate 100 may be formed.

An etching rate of the first conductive layer 130, may be greater than an etching rate of the second conductive layer 140, for example, the partially crystallized regions thereof. For example, the etching rate of the first conductive layer 130 may be about three times greater than the etching rate of the second conductive layer 140, for example, the partially crystallized regions thereof.

Figure 4:
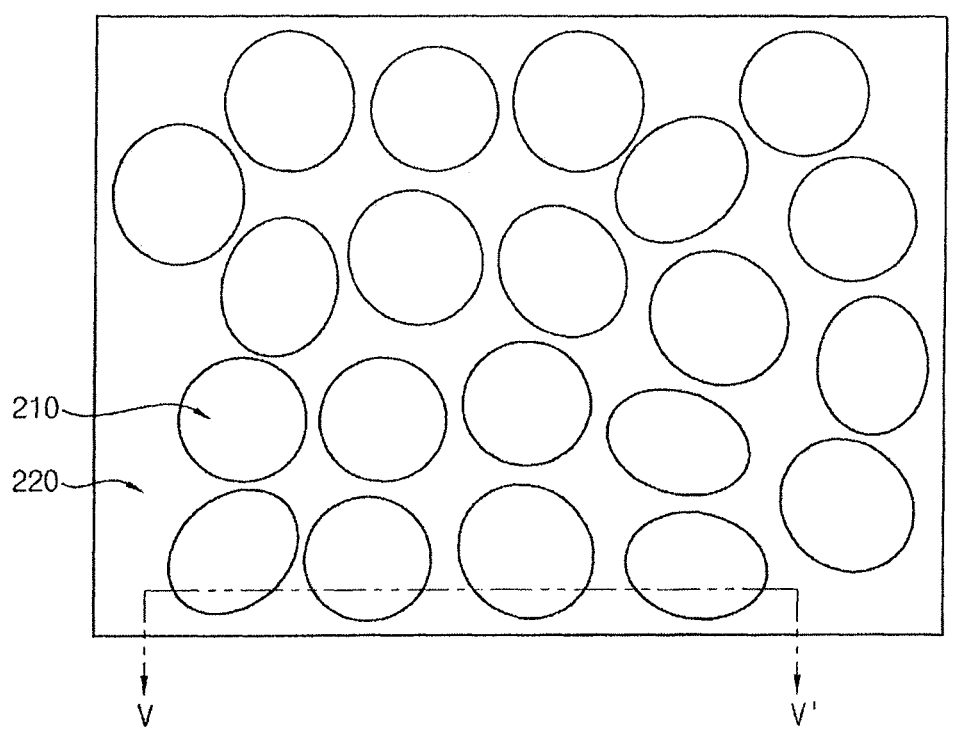
FIG. 4 illustrates a plan view of a flexible electrode according to an example embodiment.
Figure 5:
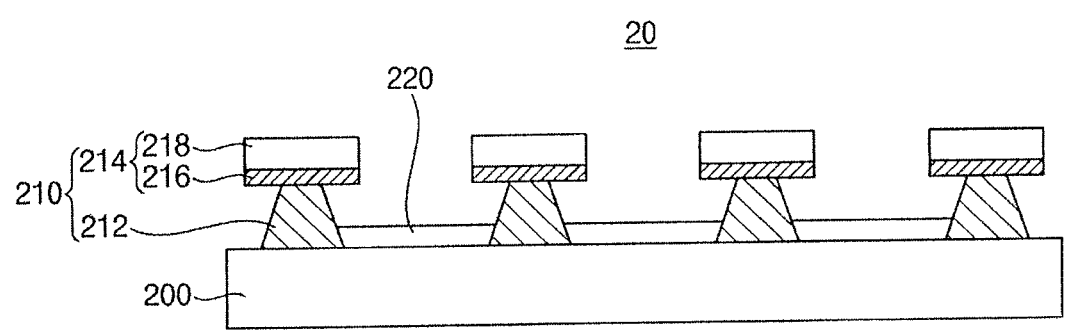
FIG. 5 illustrates a cross-sectional view of a flexible electrode according to an example embodiment.

FIG. 4 is a plan view of a flexible electrode according to an example embodiment. FIG. 5 is a cross-sectional view of a flexible electrode according to an example embodiment. FIG. 5 is a cross-sectional view cut along a line V-V' of the flexible electrode in FIG. 4.

The flexible electrode according to an example embodiment with reference to FIGS. 4 and 5 may be substantially the same as or similar to the flexible electrode according to an example embodiment with reference to FIGS. 1 and 2 except for an upper electrode pattern 214 and an electrode layer 220. Therefore, repeated explanations may be omitted.

Referring to FIGS. 4 and 5, a flexible electrode 20 according to an example embodiment may include a conductive structure 210 and an electrode layer 220.

An upper conductive pattern 214 may be disposed on a lower conductive pattern 212. The upper conductive pattern 214 may include a first upper conductive pattern 216 and a second upper conductive pattern 218.

The first upper conductive pattern 216 may be disposed on the lower conductive pattern 212. The first upper conductive pattern 216 may have a structure and a material substantially the same as or similar to that of the upper conductive pattern 114 illustrated in FIG. 2.

The second upper conductive pattern 218 may be disposed on the first upper conductive pattern 216. For example, the second upper conductive pattern 218 may have a width substantially the same as a width of the first upper conductive pattern 216.

In an example embodiment, the second upper conductive pattern 218 may include at least one of metal and transparent conductive oxide (TCO). For example, the second upper conductive pattern 218 may include metal such as titanium (Ti), copper (Cu), or silver (Ag), and/or transparent conductive oxide such as indium tin oxide (ITO). The second upper conductive pattern 218 may include a single-layer structure or a multi-layered structure. For example, the second upper conductive pattern 218 may include a single-layered structure including metal or transparent conductive oxide (e.g., Ag layer or ITO layer), a double-layered structure including metal and/or transparent conductive oxide (e.g., Ti/Cu layers), or a triple-layered structure including metal and/or transparent conductive oxide (e.g., ITO/Ag/ITO layers).

The electrode layer 220 may be disposed on a substrate 200. The electrode layer 220 may be adjacent to the conductive structure 210.

In an example embodiment, the electrode layer 220 may include at least one of metal and transparent conductive oxide (TCO). For example, the electrode layer 220 may include metal such as titanium (Ti), copper (Cu), or silver (Ag), and/or transparent conductive oxide such as indium tin oxide (ITO). The electrode layer 220 may include a single-layer structure or a multi-layered structure. For example, the electrode layer 220 may include a single-layered structure including metal or transparent conductive oxide (e.g., Ag layer or ITO layer), a double-layered structure including metal and/or transparent conductive oxide (e.g., Ti/Cu layers), or a triple-layered structure including metal and/or transparent conductive oxide (e.g., ITO/Ag/ITO layers).

In an example embodiment, the second upper conductive pattern 218 and the electrode layer 220 may have substantially the same material. For example, the second upper conductive pattern 218 and the electrode layer 220 may be simultaneously formed of the same material.

FIGS. 6A, 6B, 6C, and 6D are cross-sectional views of a method of manufacturing a flexible electrode according to an example embodiment.

Explanation of elements of a method of manufacturing a flexible electrode according to an example embodiment with reference to FIGS. 6A, 6B, 6C, and 6D, which are substantially the same as or similar to the elements of a method of manufacturing a flexible electrode according to an example embodiment with reference to FIGS. 3A, 3B, and 3C, may not be repeated.

Figure 6A:
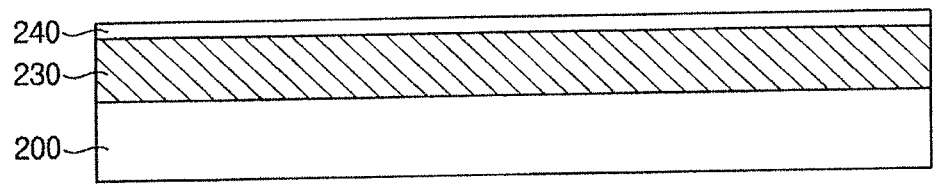
FIGS. 6A, 6B, 6C, and 6D illustrate cross-sectional views of a method of manufacturing a flexible electrode according to an example embodiment.
Figure 6B:
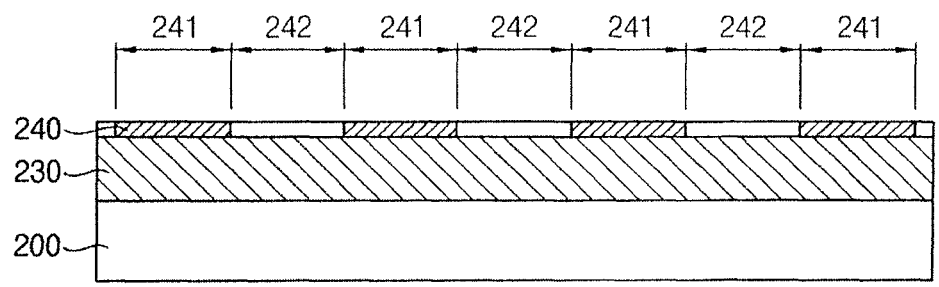

Referring to FIGS. 6A and 6B, a first conductive layer 230 and a second conductive layer 240 may be sequentially formed of transparent conductive oxide having an amorphous state on the substrate 200. Then, the second conductive layer 240 may be partially crystallized. Accordingly, transparent conductive oxide having an amorphous state in a first region 241 of the second conductive layer 240 may be crystallized thereby becoming a crystalline region 241, and a second region 242 outside the first region 241 of the second conductive layer 240 may remain as an amorphous region 242.

Figure 6C:
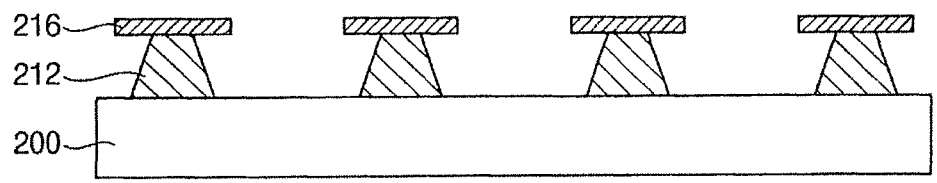

Referring to FIG. 6C, the first conductive layer 230 and the second conductive layer 240 may be etched to form the lower conductive pattern 212 and the first upper conductive pattern 216.

The second conductive layer 240 and the first conductive layer 230 may be simultaneously etched. For example, a wet etching process using an etchant may be performed to simultaneously etch the second conductive layer 240 and the first conductive layer 230. For example, the etchant may etch transparent conductive oxide having an amorphous state, however may not etch, or may more slowly etch, a transparent conductive oxide having a crystalline state.

The amorphous region 242 of the second conductive layer 240 may be etched by the etchant, and the crystalline region 241 of the second conductive layer 240 may not be etched, or may be etched less, by the etchant and remained, so that the first upper conductive pattern 216 may be formed. The first conductive layer 230 may be etched by the etchant to be partially removed. When the first conductive layer 230 is etched, the first upper conductive pattern 216 may function as an etching mask. Therefore, the first conductive layer 230 under the amorphous region 242 of the second conductive layer 240 may be substantially entirely etched by the etchant. However, the first conductive layer 230 under the crystalline region 241 of the second conductive layer 240 may be partially etched by the etchant. In this case, the first conductive layer 230 may be etched in an isotropic manner from top of the first conductive layer 230 as illustrated in FIG. 6C, therefore, the lower conductive pattern 212 having a tapered shape in which a width of the lower conductive pattern 212 increases in a direction from the first upper conductive pattern 216 to the substrate 200 may be formed.

Figure 6D:
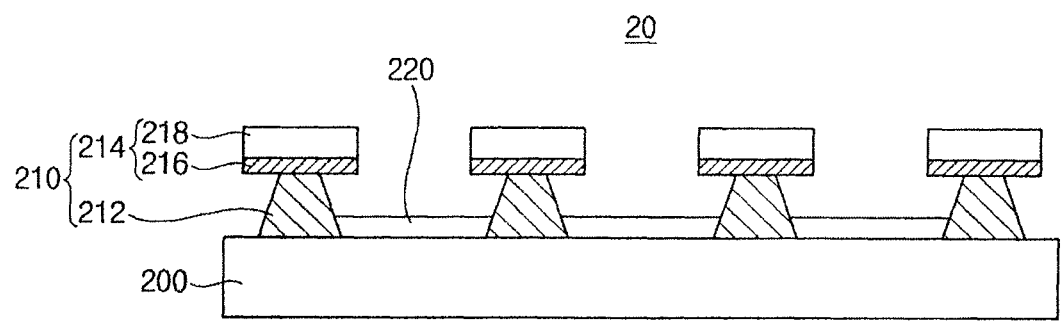

Referring to FIG. 6D, the second upper conductive pattern 218 may be formed on the first upper conductive pattern 216, and the electrode layer 220 adjacent to the conductive structure 210 may be formed on the substrate 200.

In an example embodiment, the second upper conductive pattern 218 and the electrode layer 220 may be substantially simultaneously formed. For example, a third conductive layer may be formed of metal and/or transparent conductive oxide on the substrate 200 on which the lower conductive pattern 212 and the first upper conductive pattern 216 are formed. As a method of manufacturing the third conductive layer, for example, a sputtering, a chemical vapor deposition (CVD), a physical vapor deposition (PVD), an electron beam (e-beam) process, a thermal evaporation, a thermal ion beam assisted deposition (IBAD), etc. may be used. The second upper conductive pattern 218 having a width substantially the same as a width of the first upper conductive pattern 216 may be formed on the first upper conductive pattern 216, and the electrode layer 220 may be formed on a portion of the substrate 200 on which the conductive structure 210 is not disposed.

Figure 7:
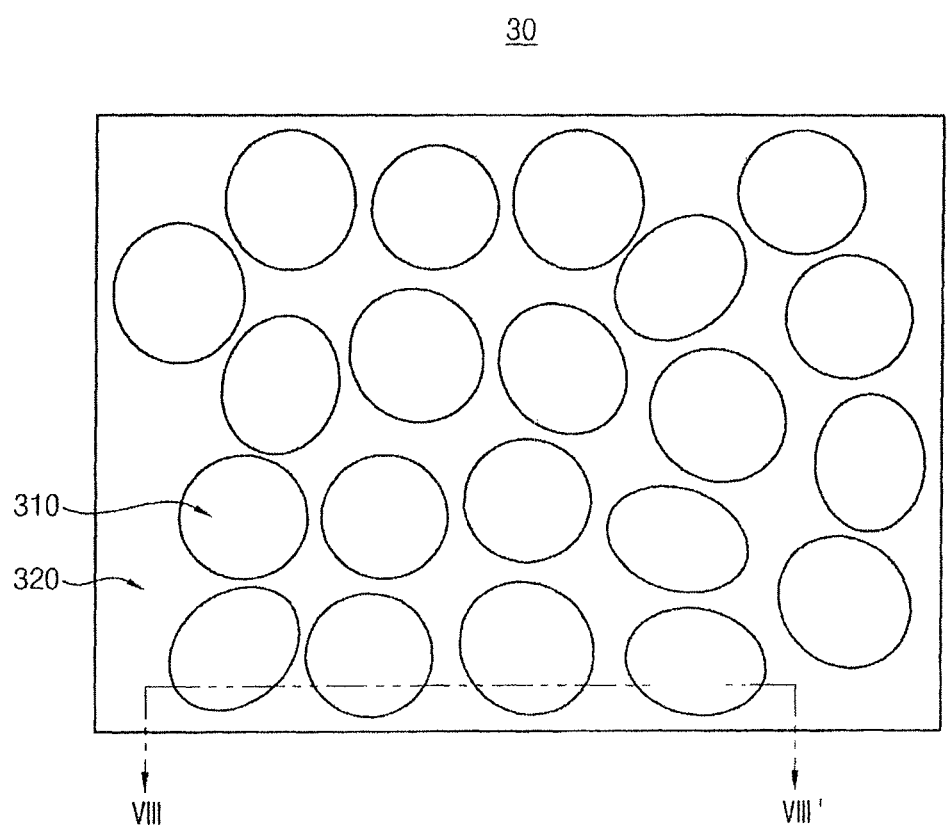
FIG. 7 illustrates a plan view of a flexible electrode according to an example embodiment.
Figure 8:
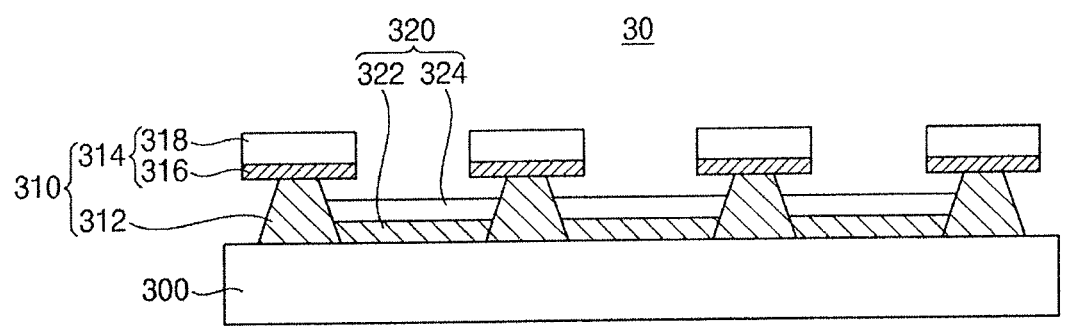
FIG. 8 illustrates a cross-sectional view of a flexible electrode according to an example embodiment.

FIG. 7 is a plan view of a flexible electrode according to an example embodiment. FIG. 8 is a cross-sectional view of a flexible electrode according to an example embodiment. FIG. 8 is a cross-sectional view cut along a line VIII-VIII' of the flexible electrode in FIG. 7.

The flexible electrode according to an example embodiment with reference to FIGS. 7 and 8 may be substantially the same as or similar to the flexible electrode according to an example embodiment with reference to FIGS. 4 and 5 except for an electrode layer 320. Therefore, repeated explanations may be omitted.

Referring to FIGS. 7 and 8, a flexible electrode 30 according to an example embodiment may include a conductive structure 310 and an electrode layer 320.

The electrode layer 320 may be disposed on a substrate 300. The electrode layer 320 may be adjacent to the conductive structure 310. The electrode layer 320 may include a first electrode layer 322 and the second electrode layer 324.

The first electrode layer 322 may be disposed on the substrate 300. The first electrode layer 322 may have a structure and a material substantially the same as or similar to the electrode layer 120 illustrated in FIG. 2.

The second electrode layer 324 may be disposed on the first electrode layer 322. The second electrode layer 324 may be adjacent to a lower conductive pattern 312 of the conductive structure 310.

In an example embodiment, the second electrode layer 324 may include at least one of metal and transparent conductive oxide (TCO). For example, the second electrode layer 324 may include metal such as titanium (Ti), copper (Cu), or silver (Ag), and/or transparent conductive oxide such as indium tin oxide (ITO). The second electrode layer 324 may include a single-layer structure or a multi-layered structure. For example, the second electrode layer 324 may include a single-layered structure including metal or transparent conductive oxide (e.g., Ag layer or ITO layer), a double-layered structure including metal and/or transparent conductive oxide (e.g., Ti/Cu layers), or a triple-layered structure including metal and/or transparent conductive oxide (e.g., ITO/Ag/ITO layers).

In an example embodiment, a second upper conductive pattern 318 and the second electrode layer 324 may have substantially the same material. For example, the second upper conductive pattern 318 and the second electrode layer 324 may be simultaneously formed of the same material.

FIGS. 9A, 9B, 9C, and 9D are cross-sectional views of a method of manufacturing a flexible electrode according to an example embodiment.

Explanations on elements of a method of manufacturing a flexible electrode according to an example embodiment with reference to FIGS. 9A, 9B, 9C, and 9D, which are substantially the same as or similar to the elements of a method of manufacturing a flexible electrode according to an example embodiment with reference to FIGS. 3A, 3B, and 3C, may not be repeated.

Figure 9A:
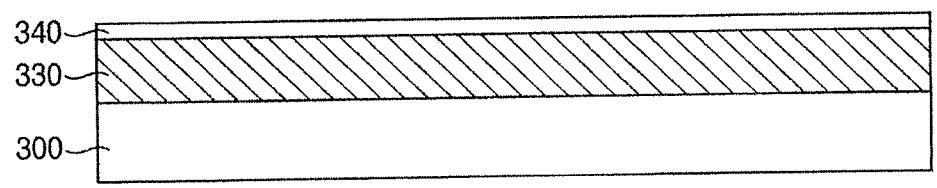
FIGS. 9A, 9B, 9C, and 9D illustrate cross-sectional views of a method of manufacturing a flexible electrode according to an example embodiment.
Figure 9B:
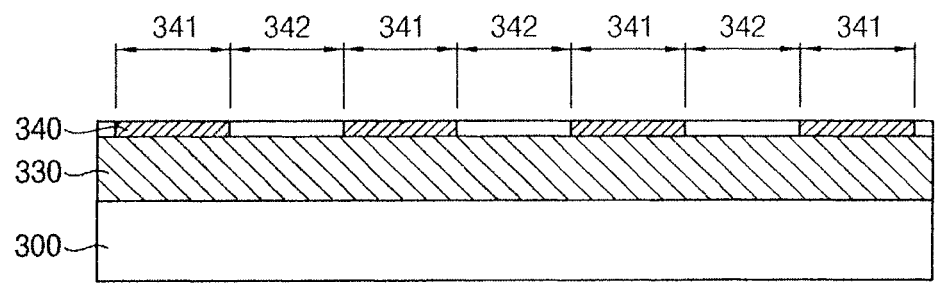
Figure 9C:
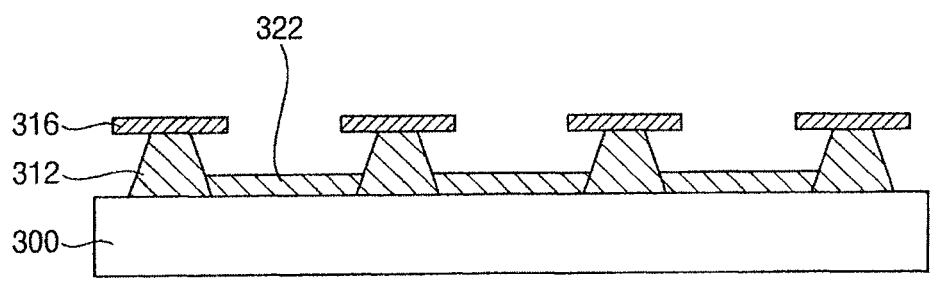

Referring to FIGS. 9A, 9B, and 9C, a first conductive layer 330 and a second conductive layer 340 may be sequentially formed of transparent conductive oxide having an amorphous state on the substrate 300. Then, the second conductive layer 340 may be partially crystallized. Accordingly, transparent conductive oxide having an amorphous state in a first region 341 of the second conductive layer 340 may be crystallized thereby becoming a crystalline region 341, and a second region 342 outside the first region 341 of the second conductive layer 340 may remain as an amorphous region 342. Then, the first conductive layer 330 and the second conductive layer 340 may be etched to form the lower conductive pattern 312, the first upper conductive pattern 316, and the first electrode layer 322.

Figure 9D:
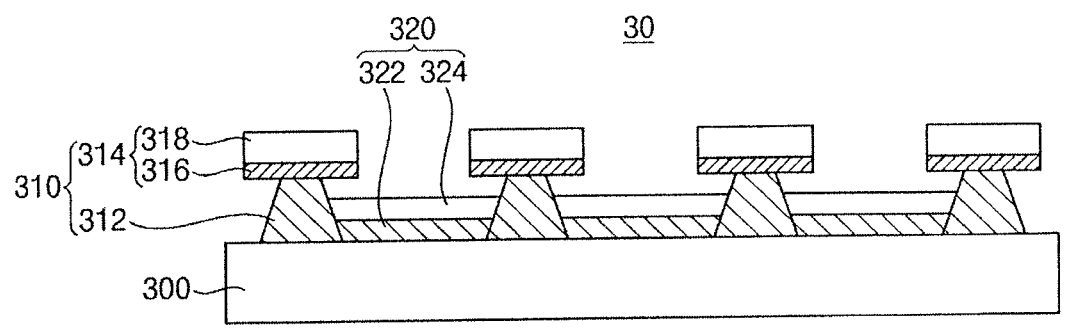

Referring to FIG. 9D, the second upper conductive pattern 318 may be formed on the first upper conductive pattern 316, and the second electrode layer 324 may be formed on the first electrode layer 322.

In an example embodiment, the second upper conductive pattern 318 and the second electrode layer 324 may be substantially simultaneously formed. For example, a third conductive layer may be formed of metal and/or transparent conductive oxide on the substrate 300 on which the lower conductive pattern 312, the first upper conductive pattern 316, and the first electrode layer 322 are formed. Therefore, the second upper conductive pattern 318 having a width substantially the same as a width of the first upper conductive pattern 316 may be formed on the first upper conductive pattern 316, and the second electrode layer 324 being in contact with the lower conductive pattern 312 may be formed on the first electrode layer 322.

A general electrode for a display device may include a single-layered structure or a multi-layered structure including metal such as silver (Ag), aluminum (Al) or transparent conductive oxide such as ITO. In this case, cracks may occur in the electrode by mechanical stress applied to the electrode when the display device is bent or folded, and sheet resistance of the electrode may increase by the cracks so that electrical conductivity of the electrode may decrease.

The flexible electrode according to example embodiments may include a plurality of conductive structures, which may each have an island shape. Cracks may not be easily generated due to improved flexibility, and the conductive structures may help prevent a diffusion of cracks when the cracks are generated. Accordingly, an increase of sheet resistance when the display device is bent or folded may be minimized, and a certain level of electrical conductivity may be maintained.

Figure 10:
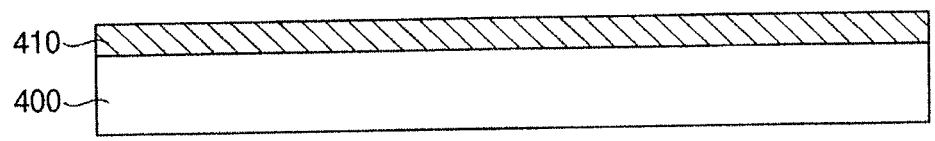
FIG. 10 illustrates a cross-sectional view of an electrode for a display device according to a comparative example.

The present disclosure will be explained below with reference to experiments according to embodiment examples and comparative examples, and experimental results thereof. These embodiment examples are illustrative and do not limit the scope of the disclosure. FIG. 10 is a cross-sectional view of an electrode for a display device according to comparative examples.

Flexible electrodes according to embodiment examples are examples of the flexible electrode 30 according to an example embodiment with reference to FIGS. 7 and 8. The lower conductive pattern 312 of the conductive structure 310 may be composed of IZO and have a thickness of about 900 Å, and the first upper conductive pattern 316 of the conductive structure 310 may be composed of ITO and have a thickness of about 300 Å. Moreover, the first electrode layer 322 of the electrode layer 320 may be composed of IZO.

An electrode according to comparative examples may include an electrode layer 410 disposed on a substrate 400. The electrode layer 410 may correspond to the second upper conductive pattern 318 and the second electrode layer 324 of the flexible electrode 30 according to an example embodiment with reference to FIGS. 7 and 8.

The second upper conductive pattern and the second electrode layer of the flexible electrode according to embodiment examples and the electrode layer of the electrode according to comparative examples may be composed of substantially the same material and have substantially the same thickness. In other words, only differences between the flexible electrode according to embodiment examples and the electrode according to comparative examples are such that the flexible electrode according to embodiment examples further includes the lower conductive pattern, the first upper conductive pattern, and the first electrode layer. Thus, unless otherwise mentioned, the second upper conductive pattern and the second electrode layer of the flexible electrode according to embodiment examples and the electrode layer of the electrode according to comparative examples are mentioned as an electrode layer below.

Figure 11A:
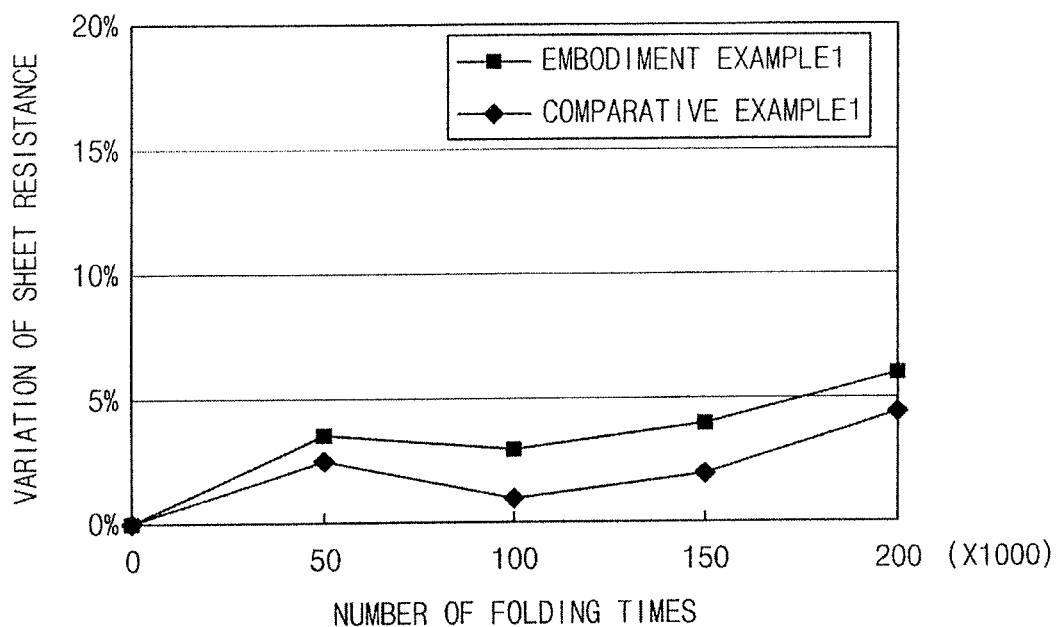
FIGS. 11A and 11B illustrate graphs comparing variation of sheet resistance between a first embodiment example and a first comparative example.
Figure 11B:
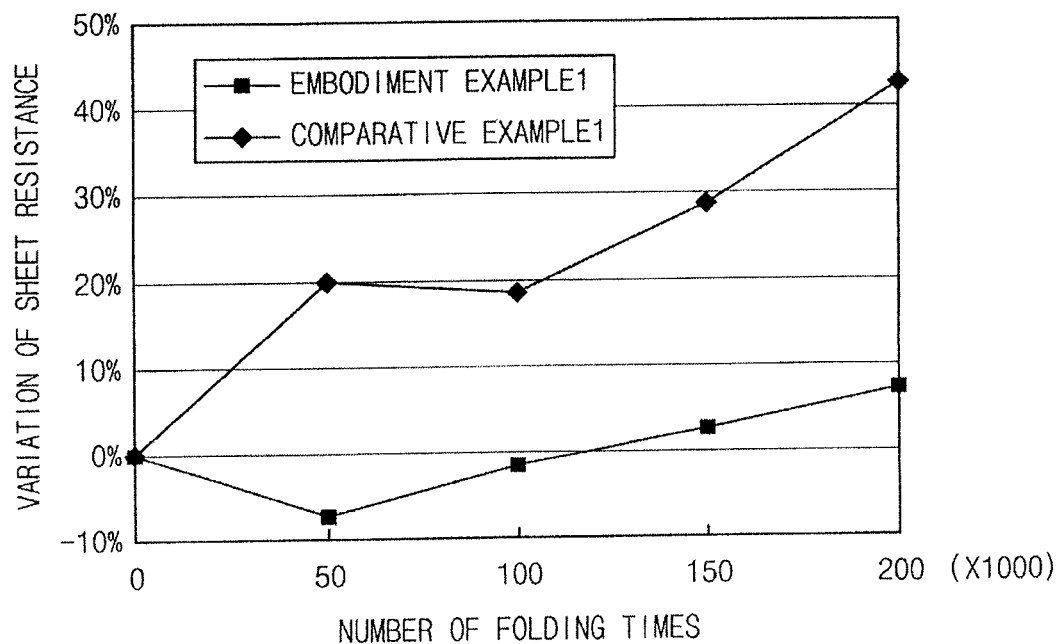

FIGS. 11A and 11B are graphs comparing variation of sheet resistance between a first embodiment example and a first comparative example. FIG. 11A illustrates an experimental result in which the flexible electrode according to the first embodiment example and the electrode according to the first comparative example are in-folded. FIG. 11B illustrates an experimental result in which the flexible electrode according to the first embodiment example and the electrode according to the first comparative example are out-folded.

In-folding means that the electrode layer disposed on the substrate is folded in order that portions of the electrode layer face each other, whereas out-folding means that the electrode layer is folded in order that portions of the substrate face each other.

A compressive stress may occur in the electrode layer when in-folded, and a tensile stress may occur in the electrode layer when out-folded. Additionally, the variation of sheet resistance may be calculated by Equation 1 below.

$$\text{variation of sheet resistance} = (R - R_0)/R_0 \quad \text{[Equation 1]}$$

In Equation 1, $R_0$ means sheet resistance ($\Omega/m^2$) of the flexible electrode according to embodiment examples and the electrode according to comparative examples before folding. Further, R means sheet resistance ($\Omega/m^2$) of the flexible electrode according to embodiment examples and the electrode according to comparative examples after folding. The sheet resistance of the electrode is inversely proportional to electrical conductivity of the electrode, so that electrical conductivity of the electrode may decrease when the sheet resistance increases according to number of folding times of the electrode. Therefore, the variation of the sheet resistance of the electrode may be desired to be limited to a certain level although the number of folding times of the electrode increases. For example, it may be desirable to keep the variation of the sheet resistance of the electrode according to the number of folding times of the electrode to under about 10%.

In first embodiment example and the first comparative example, the electrode layer may include a first metal layer and a second metal layer disposed on the first metal layer. The first metal layer may be composed of Ti and have a thickness of about 100 Å. The second metal layer may be composed of Cu and have a thickness of about 400 Å.

Referring to FIG. 11A, in an in-folding experiment, the variation of the sheet resistances of the flexible electrode according to the first embodiment example and the electrode according to the first comparative example may not exceed the certain level (e.g., about 10%) when the number of folding times of the electrode increases. Thus, the flexible electrode according to the first embodiment example and the electrode according to the first comparative example may have good electrical conductivity for a flexible display device when in-folded.

Referring to FIG. 11B, in an out-folding experiment, the variation of the sheet resistance of the flexible electrode according to the first embodiment example may not exceed the certain level (e.g., about 10%) when the number of folding times of the electrode increases, however, the variation of the sheet resistance of the electrode according to the first comparative example may exceed the certain level (e.g., about 10%) when the number of folding times of the electrode increases. Thus, the flexible electrode according to the first embodiment example may have good electrical conductivity for a flexible display device when out-folded, however, the electrode according to the first comparative example may have relatively low electrical conductivity for a flexible display device when out-folded.

Comparing the flexible electrode according to the first embodiment example and the electrode according to the first comparative example, when in-folded, both the flexible electrode according to the first embodiment example and the electrode according to the first comparative example may have good electrical conductivity for a flexible display device. However, when out-folded, the flexible electrode according to the first embodiment example may have good electrical conductivity for a flexible display device, but the electrode according to the first comparative example may have relatively low electrical conductivity for a flexible display device. Therefore, when the electrode layer includes the first metal layer composed of Ti and the second metal layer composed of Cu, the flexible electrode according to the first embodiment example may include a plurality of the conductive structures, so that flexibility when out-folded may be improved.

Figure 12A:
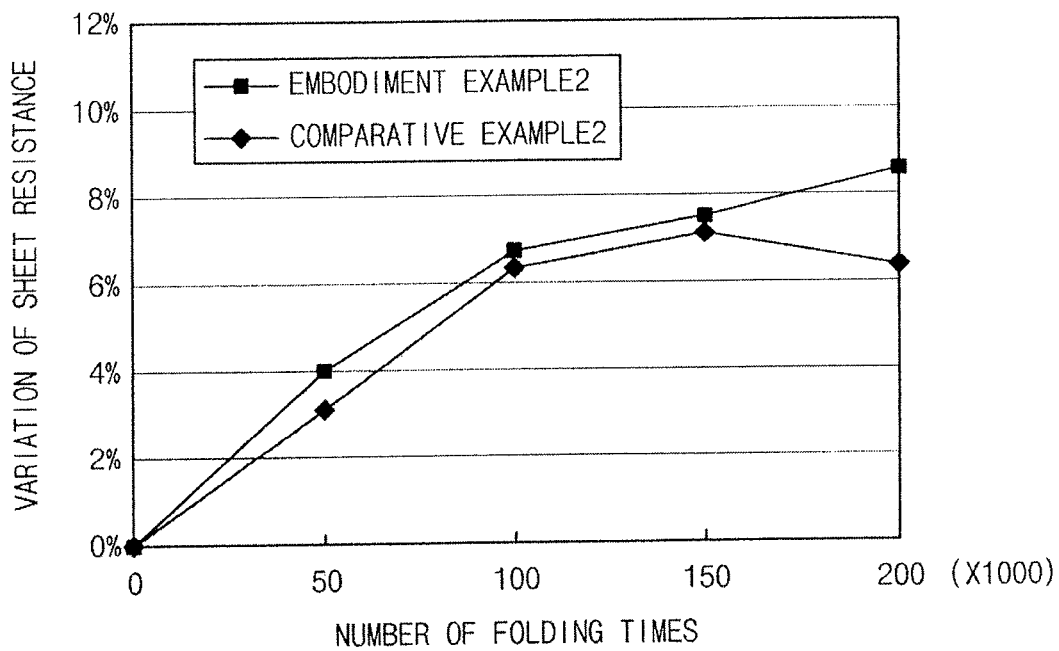
FIGS. 12A and 12B illustrate graphs comparing variation of sheet resistance between a second embodiment example and a second comparative example.
Figure 12B:
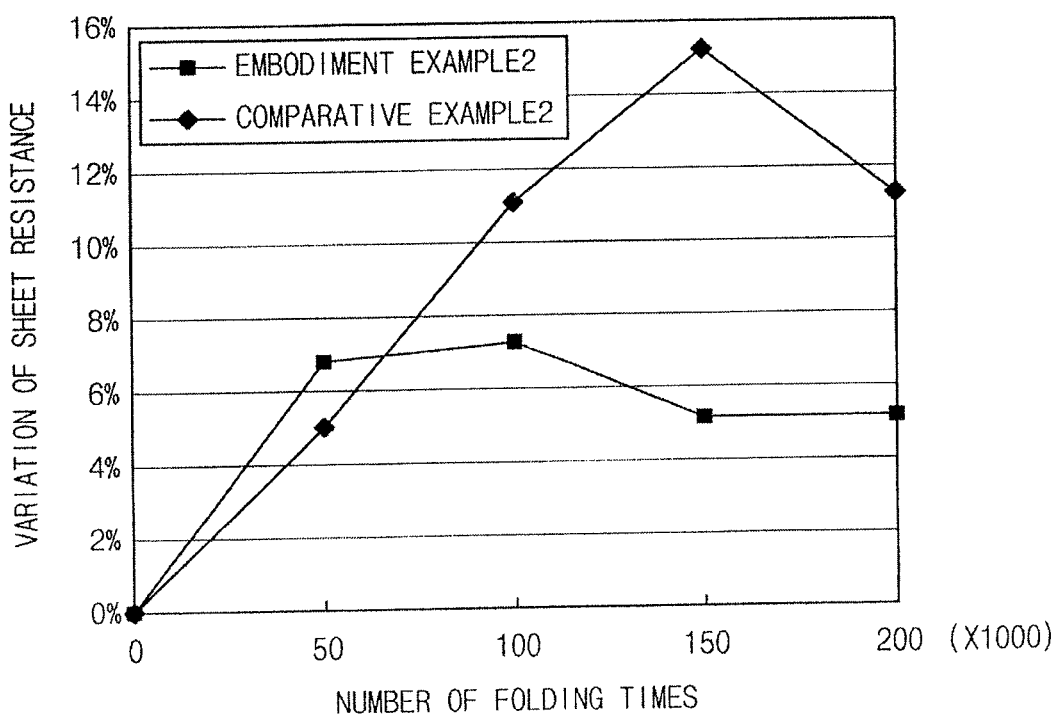

FIGS. 12A and 12B are graphs comparing variation of sheet resistance between a second embodiment example and a second comparative example. FIG. 12A illustrates an experimental result in which the flexible electrode according to the second embodiment example and the electrode according to the second comparative example are in-folded. FIG. 12B illustrates an experimental result in which the flexible electrode according to the second embodiment example and the electrode according to the second comparative example are out-folded.

In the second embodiment example and the second comparative example, the electrode layer may include a third metal layer. The third metal layer may be composed of Ag and have a thickness of about 500 Å.

Referring to FIG. 12A, in an in-folding experiment, the variation of the sheet resistances of the flexible electrode according to the second embodiment example and the electrode according to the second comparative example may not exceed the certain level (e.g., about 10%) when the number of folding times of the electrode increases. Thus, the flexible electrode according to the second embodiment example and the electrode according to the second comparative example may have good electrical conductivity for a flexible display device when in-folded.

Referring to FIG. 12B, in an out-folding experiment, the variation of the sheet resistance of the flexible electrode according to the second embodiment example may not exceed the certain level (e.g., about 10%) when the number of folding times of the electrode increases, however, the variation of the sheet resistance of the electrode according to the second comparative example may exceed the certain level (e.g., about 10%) when the number of folding times of the electrode increases. Thus, the flexible electrode according to the second embodiment example may have good electrical conductivity for a flexible display device when out-folded, however, the electrode according to the second comparative example may have relatively low electrical conductivity for a flexible display device when out-folded.

Comparing the flexible electrode according to the second embodiment example and the electrode according to the second comparative example, when in-folded, both the flexible electrode according to the second embodiment example and the electrode according to the second comparative example may have good electrical conductivity for a flexible display device. However, when out-folded, the flexible electrode according to the second embodiment example may have good electrical conductivity for a flexible display device, but the electrode according to the second comparative example may have relatively low electrical conductivity for a flexible display device. Therefore, when the electrode layer includes the third metal layer composed of Ag, the flexible electrode according to the second embodiment example may include a plurality of the conductive structures, so that flexibility when out-folded may be improved.

Figure 13A:
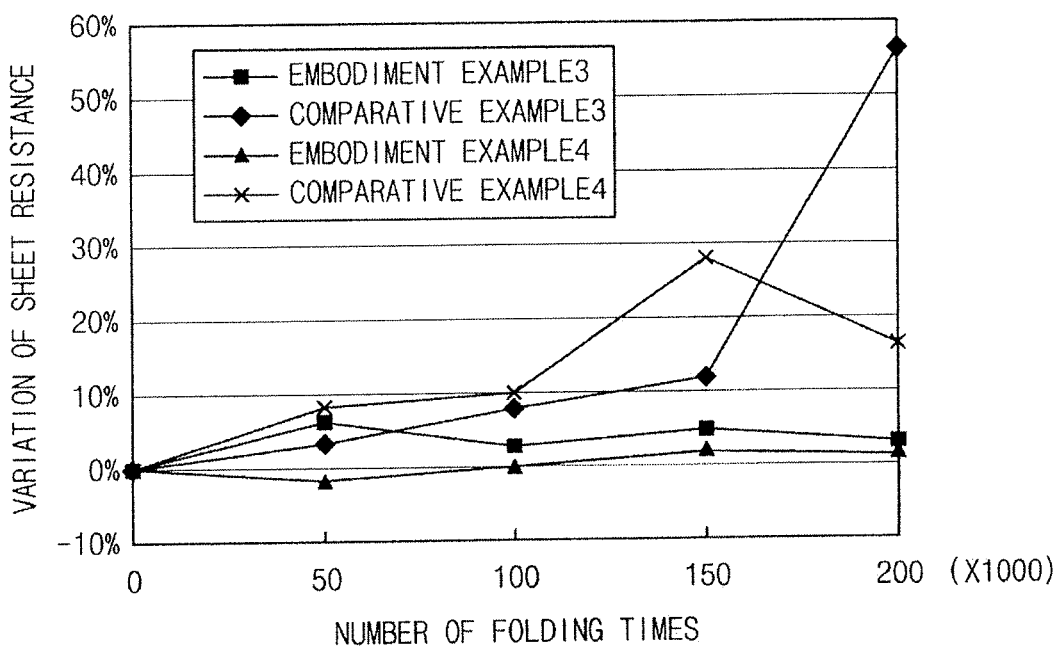
FIGS. 13A and 13B illustrate graphs comparing variation of sheet resistance between third and fourth embodiment examples and third and fourth comparative examples.
Figure 13B:
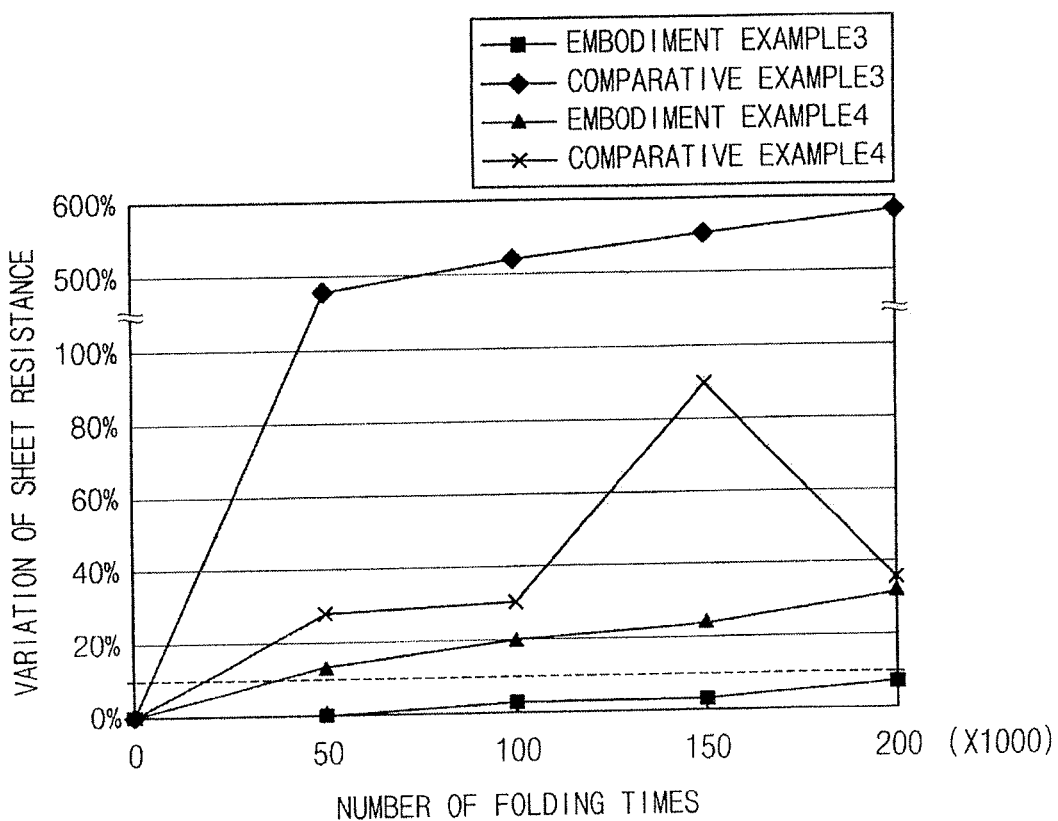

FIGS. 13A and 13B are graphs comparing variation of sheet resistance between third and fourth embodiment examples and third and fourth comparative examples. FIG. 13A illustrates an experimental result in which the flexible electrode according to the third and fourth embodiment examples and the electrode according to the third and fourth comparative examples are in-folded. FIG. 11B illustrates an experimental result in which the flexible electrode according to the third and fourth embodiment examples and the electrode according to the third and fourth comparative examples are out-folded.

In the third embodiment example and the third comparative example, the electrode layer may include a first transparent conductive oxide layer. The first transparent conductive oxide layer may be composed of amorphous ITO (a-ITO) and have a thickness of about 1000 Å. In the fourth embodiment example and the fourth comparative example, the electrode layer may include a second transparent conductive oxide layer, a fourth metal layer disposed on the second transparent conductive oxide layer, and a second transparent conductive oxide layer disposed on the fourth metal layer. The second transparent conductive oxide layer may be composed of ITO and have a thickness of about 70 Å. The fourth metal layer may be composed of Ag and have a thickness of about 50 Å. The third transparent conductive oxide layer may be composed of ITO and have a thickness of about 70 Å.

Referring to FIG. 13A, in an in-folding experiment, the variation of the sheet resistance of the flexible electrode according to the third and fourth embodiment examples may not exceed the certain level (e.g., about 10%) when the number of folding times of the electrode increases, however, the variation of the sheet resistance of the electrode according to the third and fourth comparative examples may exceed the certain level (e.g., about 10%) when the number of folding times of the electrode increases. Thus, the flexible electrode according to the third and fourth embodiment examples may have good electrical conductivity for a flexible display device when in-folded, however, the electrode according to the third and fourth comparative examples may have relatively low electrical conductivity for a flexible display device when out-folded.

Referring to FIG. 13B, in an out-folding experiment, the variation of the sheet resistance of the flexible electrode according to the third embodiment example may not exceed the certain level (e.g., about 10%) when the number of folding times of the electrode increases, however, the variation of the sheet resistances of the flexible electrode according to the fourth embodiment example and the electrode according to the third and fourth comparative examples may exceed the certain level (e.g., about 10%) when the number of folding of the electrode increases. Thus, the flexible electrode according to the third embodiment example may have good electrical conductivity for a flexible display device when out-folded, however, the flexible electrode according to the fourth embodiment example and the electrode according to the third and fourth comparative examples may have relatively low electrical conductivity for a flexible display device when out-folded.

Comparing the flexible electrode according to the third embodiment example and the electrode according to the third comparative example, when in-folded and out-folded, the flexible electrode according to the third embodiment example may have good electrical conductivity for a flexible display device, however, the electrode according to the third comparative example may have relatively low electrical conductivity for a flexible display device. Therefore, when the electrode layer includes the first transparent conductive oxide layer composed of amorphous ITO, the flexible electrode according to the third embodiment example may include a plurality of the conductive structures, so that flexibility when in-folded and out-folded may be improved.

Comparing the flexible electrode according to the fourth embodiment example and the electrode according to the fourth comparative example, when out-folded, both the flexible electrode according to the fourth embodiment example and the electrode according to the fourth comparative example may have relatively low electrical conductivity for a flexible display device. However, when in-folded, the flexible electrode according to the fourth embodiment example may have good electrical conductivity for a flexible display device, but the electrode according to the fourth comparative example may have relatively low electrical conductivity for a flexible display device. Therefore, when the electrode layer includes the second transparent conductive oxide layer composed of ITO, the fourth metal layer composed of Ag, and the third transparent conductive oxide layer composed of ITO, the flexible electrode according to the fourth embodiment example may include a plurality of the conductive structures, so that flexibility when in-folded may be improved.

The flexible electrode for the display device according to example embodiments may be applied to, for example, a display device or a flexible display device included in, for example, a computer, a notebook, a mobile phone, a smartphone, a smart pad, a PMP, a PDA, an MP3 player, or the like.

By way of summation and review, applications and uses of a flexible display device that is bendable or foldable when in use or during manufacture have been expanding. When a flexible display device is bent or folded, cracks may occur in an electrode or wiring including a single layered structure or a multi-layered structure which are composed of metal or transparent conductive oxide. Sheet resistance may increase due to the cracks so that electrical conductivity of the electrode or the wiring may decrease.

As described above, embodiments may provide a flexible electrode for a flexible display device. A flexible electrode for the display device according to an embodiment may include a plurality of the conductive structures each having an island shape and the electrode layer surrounding the conductive structures. Therefore, a flexibility of the flexible electrode may be improved. Additionally, the conductive structure may prevent a diffusion of cracks when the cracks occurred on the electrode layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible electrode for a display device, the flexible electrode comprising:
a plurality of island-shaped conductive structures arranged in two dimensions on a substrate in plan view so as to be spaced apart from one another, each conductive structure including a lower conductive pattern disposed on the substrate and an upper conductive pattern disposed on the lower conductive pattern, a width of a top surface of the lower conductive pattern being less than a width of a bottom surface of the upper conductive pattern; and
an electrode layer disposed on the substrate, the electrode layer being adjacent to and making electrical contact with each conductive structure.

2. The flexible electrode as claimed in claim 1, wherein the lower conductive pattern has a tapered shape in which a width of the lower conductive pattern decreases in a direction from the substrate to the upper conductive pattern.

3. The flexible electrode as claimed in claim 1, wherein a thickness of the lower conductive pattern is greater than a thickness of the electrode layer.

4. The flexible electrode as claimed in claim 1, wherein the lower conductive pattern includes a transparent conductive oxide having an amorphous state.

5. The flexible electrode as claimed in claim 4, wherein the transparent conductive oxide includes at least one of indium zinc oxide and aluminum zinc oxide.

6. The flexible electrode as claimed in claim 1, wherein the lower conductive pattern and the electrode layer include a same material and are in contact with one another.

7. The flexible electrode as claimed in claim 6, wherein the lower conductive pattern and the electrode layer are integrally formed.

8. The flexible electrode as claimed in claim 1, wherein the upper conductive pattern includes a transparent conductive oxide having a crystalline state.

9. The flexible electrode as claimed in claim 8, wherein the upper conductive pattern includes indium tin oxide.

10. The flexible electrode as claimed in claim 1, wherein a plurality of nano-patterns are formed on a surface of the upper conductive pattern.

11. The flexible electrode as claimed in claim 1, wherein the upper conductive pattern includes a first upper conductive pattern and a second upper conductive pattern disposed on the first upper conductive pattern.

12. The flexible electrode as claimed in claim 11, wherein the first upper conductive pattern includes a transparent conductive oxide having a crystalline state.

13. The flexible electrode as claimed in claim 12, wherein the transparent conductive oxide having a crystalline state includes indium tin oxide.

14. The flexible electrode as claimed in claim 11, wherein the second upper conductive pattern and the electrode layer include a same material.

15. The flexible electrode as claimed in claim 14, wherein the second upper conductive pattern and the electrode layer include at least one of a metal and a transparent conductive oxide.

16. The flexible electrode as claimed in claim 11, wherein the electrode layer includes a first electrode layer disposed on the substrate and a second electrode layer disposed on the first electrode layer.

17. The flexible electrode as claimed in claim 16, wherein the lower conductive pattern and the first electrode layer include a same material.

18. The flexible electrode as claimed in claim 17, wherein the lower conductive pattern and the first electrode layer are integrally formed.

19. The flexible electrode as claimed in claim 16, wherein the second upper conductive pattern and the second electrode layer include a same material.

20. The flexible electrode as claimed in claim 19, wherein the second upper conductive pattern and the second electrode layer include at least one of a metal and a transparent conductive oxide.

21. The flexible electrode as claimed in claim 1, wherein:
each lower conductive pattern is directly disposed on the substrate,
each upper conductive pattern is directly disposed on its respective lower conductive pattern, and
the electrode layer is directly disposed on the substrate.

22. The flexible electrode as claimed in claim 21, wherein the electrode layer makes direct contact with a side surface of each lower conductive pattern.

23. The flexible electrode as claimed in claim 21, wherein the electrode layer makes direct contact only with a side surface of each lower conductive pattern.

24. A flexible electrode for a display device, the flexible electrode comprising:
a conductive structure including a lower conductive pattern disposed on a substrate and an upper conductive pattern disposed on the lower conductive pattern, a width of a top surface of the lower conductive pattern being less than a width of a bottom surface of the upper conductive pattern, wherein the lower conductive pattern has a tapered shape in which a width of the lower conductive pattern decreases in a direction from the substrate to the upper conductive pattern; and
an electrode layer disposed on the substrate, the electrode layer being adjacent to the conductive structure.

\* \* \* \* \*